(12) United States Patent
Katoh

(10) Patent No.: US 11,495,509 B2
(45) Date of Patent: Nov. 8, 2022

(54) SEMICONDUCTOR DEVICE AND METHOD FOR MANUFACTURING SEMICONDUCTOR DEVICE

(71) Applicant: DENSO CORPORATION, Kariya (JP)

(72) Inventor: Nobuyuki Katoh, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/245,050

(22) Filed: Apr. 30, 2021

(65) Prior Publication Data

US 2021/0358826 A1    Nov. 18, 2021

(30) Foreign Application Priority Data

May 15, 2020 (JP) .............................. JP2020-086218

(51) Int. Cl.
*H01L 23/31* (2006.01)
*H01L 23/00* (2006.01)
(Continued)

(52) U.S. Cl.
CPC .... *H01L 23/3171* (2013.01); *H01L 21/02164* (2013.01); *H01L 21/31116* (2013.01);
(Continued)

(58) Field of Classification Search
CPC ........... H01L 23/3171; H01L 21/02164; H01L 21/31116; H01L 23/291; H01L 23/3107; H01L 23/3675; H01L 24/32; H01L 24/48; H01L 24/73; H01L 27/0664; H01L 29/45; H01L 29/66333; H01L 29/7395; H01L 2224/32245; H01L 2224/48175; H01L 2224/73265; H01L 2924/10253; H01L 2924/10254; H01L 2924/10272; H01L 2924/1033; H01L 2924/1067;
(Continued)

(56) References Cited

U.S. PATENT DOCUMENTS 9,620,584 B2 * 4/2017 Guan ................. H01L 29/7806
2004/0256730 A1 12/2004 Hirano et al.
(Continued)

FOREIGN PATENT DOCUMENTS

JP   H07-150371 A   6/1995
JP   2001-140084 A   5/2001
(Continued)

*Primary Examiner* — Thanh T Nguyen
(74) *Attorney, Agent, or Firm* — Posz Law Group, PLC

(57) ABSTRACT

In a semiconductor device, a semiconductor element includes a semiconductor substrate, a surface electrode and a protective film. The semiconductor substrate has an active region and an outer peripheral region. The surface electrode includes a base electrode disposed on a front surface of the semiconductor substrate and a connection electrode disposed on the base electrode. The protective film covers a peripheral end portion of the base electrode and an outer peripheral edge of the connection electrode. The protective film has an opening to expose the connection electrode so as to enable a solder connection. A boundary between the outer peripheral edge of the connection electrode and the protective film is located at a position corresponding to the outer peripheral region in a plan view.

8 Claims, 10 Drawing Sheets

(51) Int. Cl.
    *H01L 23/367*     (2006.01)
    *H01L 27/06*     (2006.01)
    *H01L 29/739*     (2006.01)
    *H01L 23/29*     (2006.01)
    *H01L 29/45*     (2006.01)
    *H01L 21/02*     (2006.01)
    *H01L 21/311*     (2006.01)
    *H01L 29/66*     (2006.01)
    *H02P 27/08*     (2006.01)

(52) U.S. Cl.
CPC ........ *H01L 23/291* (2013.01); *H01L 23/3107* (2013.01); *H01L 23/3675* (2013.01); *H01L 24/32* (2013.01); *H01L 24/48* (2013.01); *H01L 24/73* (2013.01); *H01L 27/0664* (2013.01); *H01L 29/45* (2013.01); *H01L 29/66333* (2013.01); *H01L 29/7395* (2013.01); *H01L 2224/32245* (2013.01); *H01L 2224/48175* (2013.01); *H01L 2224/73265* (2013.01); *H01L 2924/1033* (2013.01); *H01L 2924/1067* (2013.01); *H01L 2924/10253* (2013.01); *H01L 2924/10254* (2013.01); *H01L 2924/10272* (2013.01); *H01L 2924/1203* (2013.01); *H01L 2924/13055* (2013.01); *H02P 27/08* (2013.01)

(58) Field of Classification Search
CPC ... H01L 2924/1203; H01L 2924/13055; H01L 24/03; H01L 24/33; H01L 24/83; H01L 21/3105; H01L 23/051; H01L 24/06; H01L 24/29; H01L 2224/0383; H01L 2224/04026; H01L 2224/04042; H01L 2224/05019; H01L 2224/05073; H01L 2224/26175; H01L 2224/83007; H01L 2224/83801; H01L 21/32131; H01L 21/78; H01L 23/3192; H01L 23/562; H01L 2224/02166; H01L 2224/05554; H01L 2224/48247; H01L 24/05; H01L 2224/0603; H01L 2224/06181; H01L 2224/48091; H01L 2924/00014; H01L 2924/181; H01L 23/4334; H01L 23/49503; H01L 21/4825; H01L 23/3672; H01L 23/49548; H02P 27/08
See application file for complete search history.

(56) References Cited

U.S. PATENT DOCUMENTS

| | | |
|---|---|---|
| 2007/0158850 A1 | 7/2007 | Hirano et al. |
| 2017/0263738 A1* | 9/2017 | Soeno ................ H01L 29/0638 |
| 2021/0143272 A1* | 5/2021 | Ebihara ............... H01L 29/6606 |

FOREIGN PATENT DOCUMENTS

| | | |
|---|---|---|
| JP | 2006-156772 A | 6/2006 |
| JP | 2006-186304 A | 7/2006 |
| JP | 2006-294797 A | 10/2006 |
| JP | 2015-015395 A | 1/2015 |
| JP | 2015-023183 A | 2/2015 |
| JP | 6249933 B2 | 12/2017 |
| JP | 2018-67592 A | 4/2018 |
| JP | 2018-085421 A | 5/2018 |

* cited by examiner

SEMICONDUCTOR DEVICE AND METHOD FOR MANUFACTURING SEMICONDUCTOR DEVICE

CROSS REFERENCE TO RELATED APPLICATION

The present application claims the benefit of priority from Japanese Patent Application No. 2020-86218 filed on May 15, 2020. The entire disclosures of the above application are incorporated herein by reference.

TECHNICAL FIELD

The present disclosure relates to a semiconductor device and a method for manufacturing a semiconductor device.

BACKGROUND

For example, JP 2005-19447 A discloses a semiconductor device having a semiconductor element as a part of a power conversion unit. The disclosure of the JP 2005-19447 A, as a prior art literature, is incorporated herein by reference as for explanations of technical elements of this specification.

SUMMARY

The present disclosure describes a semiconductor device and a method for manufacturing a semiconductor device. The semiconductor device includes a semiconductor element having a semiconductor substrate, a surface electrode and a protective film. The semiconductor substrate has an active region and an outer peripheral region. The surface electrode includes a base electrode disposed on a front surface of the semiconductor substrate and a connection electrode disposed on the base electrode. The protective film covers a peripheral end portion of the base electrode and an outer peripheral edge of the connection electrode. The protective film has an opening to expose the connection electrode so as to enable a solder connection. A boundary between the outer peripheral edge of the connection electrode and the protective film is located at a position corresponding to the outer peripheral region in a plan view.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
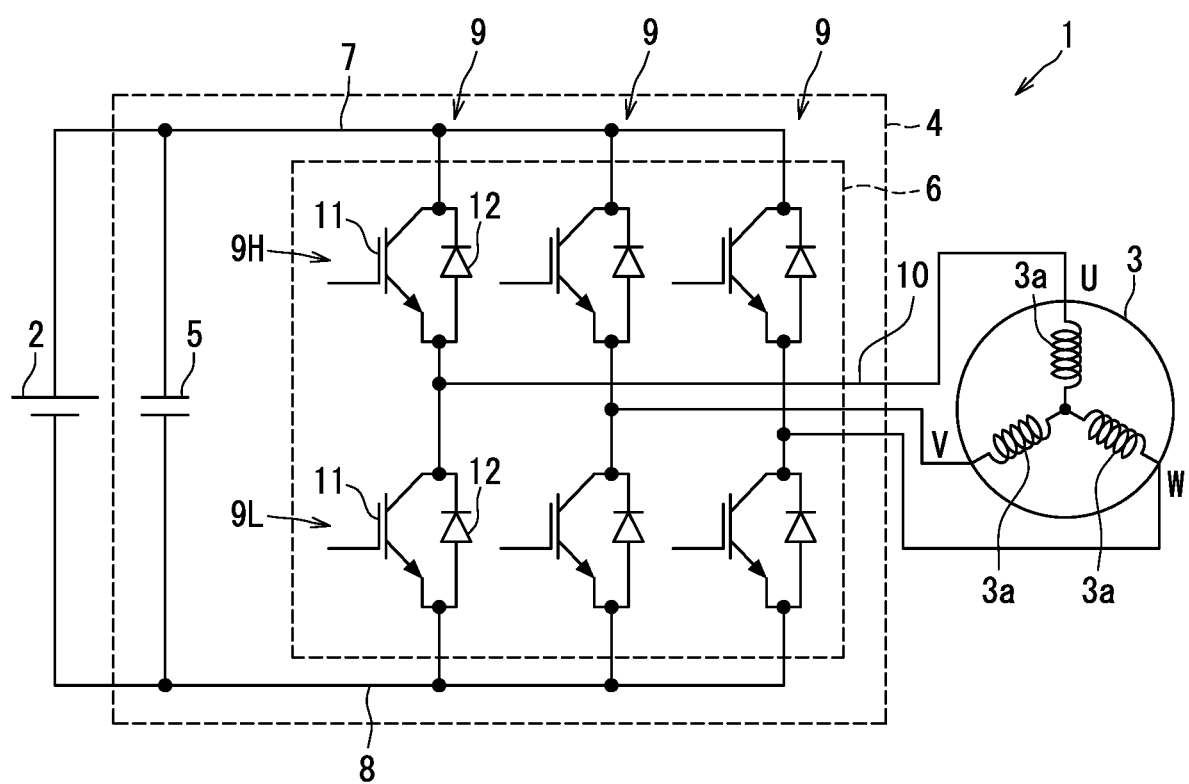
FIG. 1 is a diagram illustrating a schematic configuration of a vehicle drive system employing a semiconductor device according to a first embodiment.

In a semiconductor device, an emitter electrode may be formed on the surface of a semiconductor substrate. In a semiconductor device of JP 2005-19447 A, an emitter electrode has a base electrode made of an Al alloy and a connection electrode disposed on the base electrode. The connection electrode is disposed in the opening of a protective film. The boundary (interface) between an outer peripheral edge of the connection electrode and the protective film is located at a position corresponding to an active region of the semiconductor substrate in a plan view of the semiconductor substrate as projected in a plate thickness direction of the semiconductor substrate.

In such a configuration, in the solder-bonded state, cracks are likely to occur in the base electrode directly under the boundary, that is, directly under the outer peripheral edge of the connection electrode, due to stress of such as a power cycle or a cold cycle. The cracks may extend to the active region of the semiconductor substrate located directly under the boundary.

The present disclosure provides a semiconductor device and a method for manufacturing a semiconductor device, which are capable of suppressing damage to an active region due to thermal stress.

According to an aspect of the present disclosure, a semiconductor device includes a semiconductor element for constituting a power conversion device. The semiconductor element includes a semiconductor substrate, a surface electrode, and a protection film. The semiconductor substrate has an active region, as an element formation region, adjacent to a front surface of the semiconductor substrate and an outer peripheral region surrounding the active region in a plan view projected in a substrate thickness direction orthogonal to the front surface of the semiconductor substrate. The surface electrode includes a base electrode disposed on the front surface of the semiconductor substrate and a connection electrode disposed on the base electrode. The protective film covers a peripheral end portion of the base electrode and an outer peripheral edge of the connection electrode. The protective film defines an opening to expose the connection electrode so as to enable a solder connection to the connection electrode. Further, the connection electrode is disposed such that a boundary between the outer peripheral edge of the connection electrode and the protective film is located at a position corresponding to the outer peripheral region of the semiconductor substrate in the plan view in the substrate thickness direction.

In the semiconductor device according to the above described aspect, the boundary between the outer peripheral edge of the connection electrode and the protective film is located at the position away from the active region. Therefore, even if a thermal stress due to such as a power cycle and a cold heat cycle is concentrated in a portion directly under the boundary, it is less likely that cracks will develop into the active region. Accordingly, it is possible to restrict the active region from being damaged by thermal stress.

According to an aspect of the present disclosure, a method for manufacturing a semiconductor device having a semiconductor element for constituting a power conversion device, includes: preparing a semiconductor wafer having an active region adjacent to a front surface of the semiconductor wafer and an outer peripheral region surrounding the active region; forming a silicon oxide film entirely over the front surface of the semiconductor wafer; patterning the silicon oxide film to form a contact hole that encompasses the active region; forming a base electrode entirely over the front surface so as to cover the silicon oxide film; patterning the base electrode so that the base electrode has a peripheral end portion overlapping on a peripheral portion of the contact hole of the silicon oxide film; forming a connection electrode entirely over the front surface so as to cover the base electrode and the silicon oxide film; removing a part of the connection electrode formed on the silicon oxide film by utilizing a difference in adhesion of the connection electrode to the silicon oxide film and the base electrode, to thereby form a surface electrode including the base electrode and the connection electrode stacked on the base electrode; forming a protective film entirely over the front surface so as to cover the surface electrode and the silicon oxide film; patterning the protective film so as to form an opening to expose a part of the connection electrode, as a solder connection part, and remove a part of the protective film above a scribe region; and after the patterning the protective film, cutting the semiconductor wafer along the scribe region, to thereby produce the semiconductor element.

In the method according to the above described aspect, the silicon oxide film is formed entirely over the front surface of the semiconductor wafer excluding the part to which the surface electrode is connected, that is, excluding the part to be exposed from the contact hole. The part of the connection electrode formed on the silicon oxide film is removed by utilizing the difference of adhesion of the connection electrode to the base electrode and the silicon oxide film and the difference of in-film residual stress, whereas the part of the connection electrode formed on the base electrode is left. As such, the connection electrode is patterned without using a photoresist, and the boundary between the outer peripheral edge of the connection electrode and the protective film can be provided at the position away from the active region. Accordingly, the damage to the active region due to the thermal stress can be suppressed.

Hereinafter, a plurality of embodiments will be described with reference to the drawings. In the embodiments, parts that are functionally and/or structurally corresponding to each other and/or associated with each other are given the same reference numerals. For corresponding parts and/or associated elements, it is possible to make reference to the description of other embodiments.

A semiconductor device of the present embodiment is applied to, for example, a power conversion device for a moving body driven by a rotary electric machine. The moving body is, for example, an electrically driven vehicle such as an electric vehicle (EV), a hybrid vehicle (HV), a fuel cell vehicle (FCV), a flying vehicle such as a drone, a ship, a construction machine, or an agricultural machine. In the following, an example in which the semiconductor device is applied to a power conversion device for a vehicle will be described.

First Embodiment

First, a schematic configuration of a vehicle drive system will be described with reference to FIG. 1.

<Vehicle Drive System>

As shown in FIG. 1, a vehicle drive system 1 includes a DC power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotary electric machine. The motor generator 3 functions as a vehicle driving power source, that is, an electric motor. The motor generator 3 functions also as a generator during regeneration. The power conversion device 4 performs electric power conversion between the DC power supply 2 and the motor generator 3.

<Power Conversion Device>

Next, a circuit configuration of the power conversion device 4 will be described with reference to FIG. 1. The power conversion device 4 includes a smoothing capacitor 5 and an inverter 6.

The smoothing capacitor 5 smooths a DC voltage supplied from the DC power supply 2. The smoothing capacitor 5 is connected to a P line 7, which is a power line on the high potential side, and an N line 8, which is a power line on the low potential side. The P line 7 is connected to a positive electrode of the DC power supply 2, and the N line 8 is connected to a negative electrode of the DC power supply 2. A positive electrode of the smoothing capacitor 5 is connected to the P line 7 at a position between the DC power supply 2 and the inverter 6. Similarly, a negative electrode of the smoothing capacitor 5 is connected to the N line 8 at a position between the DC power supply 2 and the inverter 6. The smoothing capacitor 5 is connected in parallel to the DC power supply 2.

The inverter 6 is a DC-to-AC conversion circuit. The inverter 6 converts the DC voltage into a three-phase AC voltage in accordance with a switching control by a control circuit (not shown), and outputs the three-phase AC voltage to the motor generator 3. As a result, the motor generator 3 is driven to generate a predetermined torque. At the time of regenerative braking of the vehicle, the inverter 6 converts the three-phase AC voltage, which is generated by the motor generator 3 by receiving the rotational force from the wheels, into a DC voltage in accordance with the switching control by the control circuit, and outputs the DC voltage to the P line 7. In such a manner, the inverter 6 performs bidirectional electric power conversion between the DC power supply 2 and the motor generator 3.

The inverter 6 includes upper and lower arm circuits 9 for three phases. The upper and lower arm circuit 9 will also be referred to as a leg. The upper and lower arm circuit 9 includes an upper arm 9H and a lower arm 9L. The upper arm 9H and the lower arm 9L are connected in series, between the P line 7 and the N line 8 such that the upper arm 9H is adjacent to the P line 7 and the lower arm 9L is adjacent to the N line 8. The connection point between the upper arm 9H and the lower arm 9L is connected to a winding 3a of the corresponding phase in the motor generator 3 via an output line 10. The inverter 6 has six arms. At least a part of each of the P line 7, the N line 8, and the output line 10 is provided by a conductive member such as a bus bar.

In the present embodiment, a switching element constituting each arm is provided by an insulated gate bipolar transistor 11 (hereinafter referred to as the IGBT 11). A reverse flow diode 12 (hereinafter referred to as the FWD 12) is connected in antiparallel to each IGBT 11. In the upper arm 9H, a collector of the IGBT 11 is connected to the P line 7. In the lower arm 9L, an emitter of the IGBT 11 is connected to the N line 8. An emitter of the IGBT 11 of the upper arm 9H and a collector of the IGBT 11 of the lower arm 9L are connected to each other. An anode of the FWD 12 is connected to the emitter of the corresponding IGBT 11, and a cathode of the FWD 12 is connected to the collector of the corresponding IGBT 11.

The power conversion device 4 may further include a converter as a power conversion circuit. In such a case, the converter is a DC-to-DC conversion circuit that converts a DC voltage into a DC voltage having a different value. The converter is provided between the DC power supply 2 and the smoothing capacitor 5. The converter is configured to include, for example, a reactor and the above-mentioned upper and lower arm circuits 9. In such a configuration, it is possible to step up and down the voltage. The power conversion device 4 may include a filter capacitor that removes power supply noise from the DC power supply 2. In such a case, the filter capacitor is provided between the DC power supply 2 and the converter.

The power conversion device 4 may include a drive circuit for driving switching elements constituting the inverter 6 or the like. The drive circuit supplies a drive voltage to the gate of the IGBT 11 of the corresponding arm based on a drive command from a control circuit. The drive circuit drives the corresponding IGBT 11, that is, turns on and off the corresponding IGBT 11, by applying the drive voltage. The drive circuit may also be referred to as a driver.

The power conversion device 4 may include a control circuit for the switching elements. In such a case, the control circuit generates a drive command for operating the IGBT 11 and outputs the drive command to the drive circuit. The control circuit generates the drive command based on a torque request provide from a higher-level ECU (not shown) or signals detected by various sensors. Examples of the various sensors include a current sensor, a rotation angle sensor, and a voltage sensor. The current sensor detects the phase current flowing through the winding 3a of each phase. The rotation angle sensor detects the rotation angle of a rotor of the motor generator 3. The voltage sensor detects the voltage across the smoothing capacitor 5. The control circuit outputs, for example, a PWM signal as the drive command. The control circuit includes, for example, a microcomputer. "ECU" is an abbreviation for "Electronic Control Unit". "PWM" is an abbreviation for "Pulse Width Modulation".

<Semiconductor Device>

Figure 2:
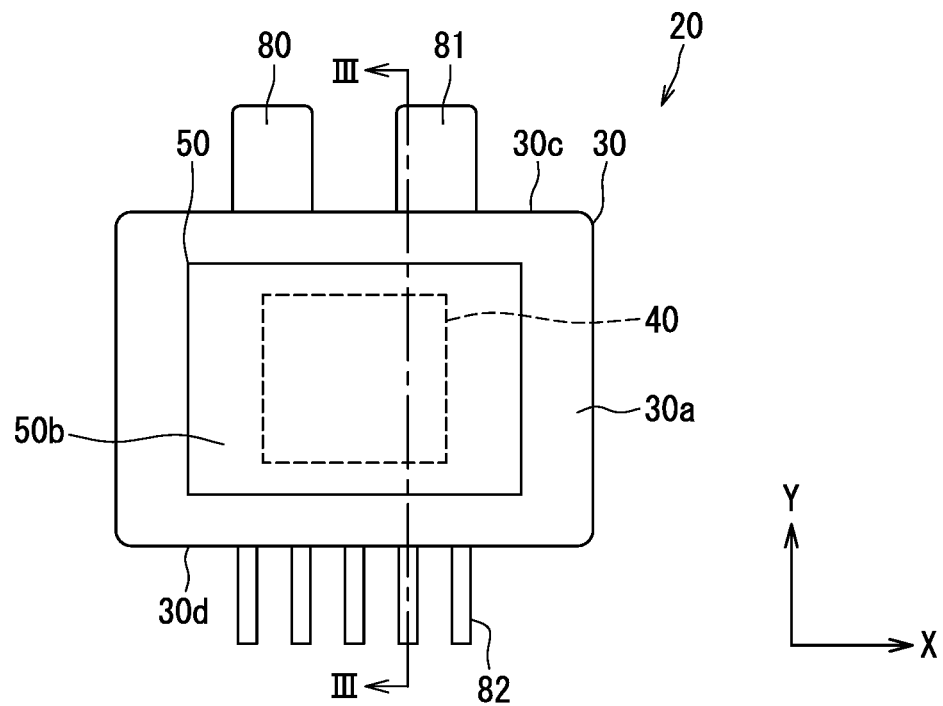
FIG. 2 is a diagram illustrating a plan view of the semiconductor device according to the first embodiment.
Figure 3:
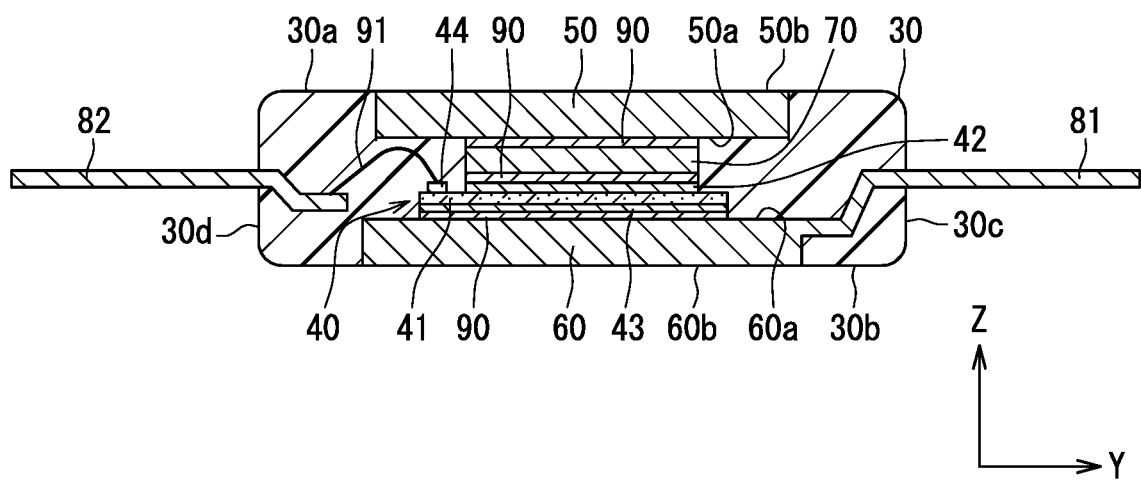
FIG. 3 is a diagram illustrating a cross-sectional view taken along a line III-III in FIG. 2.

Next, a schematic configuration of a semiconductor device to which a semiconductor element is applied will be described with reference to FIGS. 2 and 3. FIG. 2 is a plan view of the semiconductor device. FIG. 2 is a plan view of the semiconductor device, when viewed from the top side. FIG. 3 is a cross-sectional view taken along a line III-III of FIG. 2. In FIG. 3, the structure of the semiconductor element 40 is simplified.

Hereinafter, a plate thickness direction of the semiconductor element is defined as a Z direction. The plate thickness direction is a direction in which a thickness of the semiconductor element or the semiconductor substrate is measured, and corresponds to a direction normal to a surface of the semiconductor element. The plate thickness direction may also be referred to as a substrate thickness direction. A direction orthogonal to the Z direction and corresponding to an alignment direction of a plurality of pads is defined as an X direction. A direction orthogonal to both the Z direction and the X direction is defined as a Y direction. Unless otherwise specified, a shape in a plan view when viewed or projected in the Z direction, that is, a shape along an XY plane including the X and Y directions is referred to as a planar shape. Further, a plan view in the Z direction may be simply referred to as the plan view. The plan view is a view as projected in the Z direction.

As shown in FIGS. 2 and 3, a semiconductor device 20 includes a sealing resin body 30, a semiconductor element 40, heat sinks 50 and 60, a terminal member 70, main terminals 80 and 81, and signal terminals 82. The semiconductor device 20 constitutes one arm. That is, two semiconductor devices 20 constitute the upper and lower arm circuit 9 for one phase.

The sealing resin body 30 seals a part of other elements constituting the semiconductor device 20. The rest of the other elements are exposed to the outside of the sealing resin body 30. The sealing resin body 30 is made of, for example, an epoxy resin. The sealing resin body 30 is formed by, for example, a transfer molding technique. As shown in FIG. 2, the sealing resin body 30 has a substantially rectangular shape in a plan view. The sealing resin body 30 has a front surface 30a and a back surface 30b opposite to the front surface 30a in the Z direction. The front surface 30a and the back surface 30b are, for example, flat surfaces.

The semiconductor element 40 is provided by a semiconductor substrate 41 formed with a vertical element. The semiconductor substrate 41 is made of silicon (Si), a wide bandgap semiconductor having a wider bandgap than silicon, or the like. Examples of the wide bandgap semiconductor include silicon carbide (SiC), gallium nitride (GaN), gallium oxide ($Ga_2O_3$), and diamond. The vertical element is formed such that the main current flows in the plate thickness direction of the semiconductor element 40 (semiconductor substrate 41), that is, in the Z direction. In the present embodiment, the vertical element includes the IGBT 11 and FWD 12, which form one arm. That is, the semiconductor element 40 has a RC (reverse conducting)-IGBT as the vertical element. The vertical element is a heat generating element that generates heat when conducted with electricity. The semiconductor element 40 may also be referred to as a semiconductor chip.

The semiconductor element 40 has a gate electrode (not shown) formed on the semiconductor substrate 41. The gate electrode has, for example, a trench structure. The semiconductor element 40 has a main electrode on each of plate surfaces of the semiconductor substrate 41. The plate surfaces of the semiconductor substrate 41 are surfaces facing in the Z direction. The main current flows between the main electrodes. The main electrodes include an emitter electrode 42 formed adjacent to a front surface 41a of the semiconductor substrate 41 and a collector electrode 43 formed adjacent to a back surface 41b of the semiconductor substrate 41 opposite to the front surface 41a. The front surface 41a of the semiconductor substrate 41 is the surface adjacent to the front surface 30a of the sealing resin body 30. The emitter electrode 42 corresponds to a surface electrode.

The emitter electrode 42 also serves as an anode electrode of the diode. The collector electrode 43 also serves as a cathode electrode of the diode. The collector electrode 43 is formed on substantially the entire back surface 41b of the semiconductor substrate 41. The emitter electrode 42 is formed on a part of the front surface 41a of the semiconductor substrate 41. On the front surface 41a of the semiconductor substrate 41, pads 44, which are electrodes for signals, are formed in a region different from the region where the emitter electrode 42 is formed. The pads 44 are electrically isolated from the emitter electrode 42. The pads 44 are formed at an end part on the front surface 41a of the semiconductor substrate 41, the end part being opposite to the region where the emitter electrode 42 is formed, in the Y direction. The pads 44 are aligned with the emitter electrodes 42 in the Y direction.

The pads 44 includes at least a pad for the gate electrode. The semiconductor element 40 of the present embodiment has five pads 44. Specifically, the five pads 44 are provided for the gate electrode, a Kelvin emitter for detecting a potential of the emitter electrode 42, a current sense, an anode potential of a temperature sensor (temperature sensitive diode) for detecting the temperature of the semiconductor element 40, and a cathode potential. The five pads 44 are collectively formed at the end of the semiconductor element 40, which has substantially the rectangular shape in the plan view, in the Y direction. Also, the five pads 44 are arranged side by side in the X direction.

The heat sinks 50 and 60 are arranged so as to interpose the semiconductor element 40 in the Z direction. The heat sinks 50 and 60 are arranged so as to face each other in the Z direction. The heat sinks 50 and 60 encompass the semiconductor element 40 in the plan view. The heat sinks 50 and 60 dissipate heat generated by the semiconductor element 40 to the outside from both sides of the semiconductor device 20. For example, the heat sinks 50 and 60 may be each provided by a direct bonded copper (DBC) plate, a metal plate made of such as Cu or a Cu alloy, or the like. The heat sinks 50 and 60 may each have a plating film made of such as Ni orAu on its surface. In the present embodiment, the heat sinks 50 and 60 are metal plates made of Cu as a material.

The heat sink 50 has a facing surface 50a adjacent to the semiconductor element 40, and a back surface 50b opposite to the facing surface 50a. Similarly, the heat sink 60 has a facing surface 60a and a back surface 60b. The heat sinks 50 and 60 each have a substantially rectangular shape in the plan view. The back surfaces 50b and 60b of the heat sinks 50 and 60 are exposed from the sealing resin body 30. The back surfaces 50b and 60b may be referred to as heat radiation surfaces or exposed surfaces.

The heat sink 50 is arranged on a side adjacent to the emitter electrode 42 of the semiconductor element 40 in the Z direction, and is electrically connected to the emitter electrode 42 via a solder 90. The heat sink 50 functions as a wiring member that electrically connects the emitter electrode 42 to another member. The heat sink 50 is connected to the emitter electrode 42 via the terminal member 70. The solder 90 is interposed between the heat sink 50 and the terminal member 70, and between the terminal member 70 and the emitter electrode 42, respectively. The back surface 50b of the heat sink 50 is substantially flush with the front surface 30a of the sealing resin body 30. The solder 90 is a multi-element lead-free solder containing Cu, Ni and the like, in addition to Sn.

The terminal member 70 is interposed between the semiconductor element 40 and the heat sink 50 in the Z direction, and electrically interconnects the emitter electrode 42 and the heat sink 50. The terminal member 70 is located in a middle of the electrical conduction and heat conduction path between the semiconductor element 40 (emitter electrode 42) and the heat sink 50. The terminal member 70 is a columnar body formed by using a metal material such as Cu or a Cu alloy. The terminal member 70 may have a plating film on its surface. The terminal member 70 may be referred to as a metal block body or an interconnection member. In the present embodiment, the terminal member 70 is a columnar body having a substantially rectangular shape in the plan view.

The heat sink 60 is arranged on a side adjacent to the collector electrode 43 of the semiconductor element 40 in the Z direction, and is electrically connected to the collector electrode 43 via the solder 90. The heat sink 60 functions as a wiring member that electrically connects the collector electrode 43 to another member. A solder joint is formed between the facing surface 60a of the heat sink 60 and the collector electrode 43 of the semiconductor element 40. The back surface 60b of the heat sink 60 is substantially flush with the back surface 30b of the sealing resin body 30.

The main terminals 80 and 81 and the signal terminals 82 are external connection terminals for electrically connecting the semiconductor device 20 to external devices. The main terminals 80 and 81 are electrically connected to the main electrodes. The main terminal 80 is electrically connected to the emitter electrode 42. The main terminal 80 may also be referred to as an emitter terminal. The main terminal 81 is electrically connected to the collector electrode 43. The main terminal 81 may also be referred to as a collector terminal.

The main terminal 80 is connected to the emitter electrode 42 via the heat sink 50. The main terminal 80 connects to one end of the heat sink 50 in the Y direction. The main terminal 80 has a thickness smaller than that of the heat sink 50. The main terminal 80 connects to the heat sink 50 so as to be substantially flush with the facing surface 50a, for example. The main terminal 80 and the heat sink 50 may be provided by an integral member, so that the main terminal 80 connects to the heat sink 50. Alternatively, the main terminal 80 and the heat sink 50 may be provided by separate members, and be connected to each other so that the main terminal 80 connects to the heat sink 50.

In the present embodiment, the main terminal 80 is provided integrally with the heat sink 50 as a part of the lead frame. The main terminal 80 extends in the Y direction from the heat sink 50 and projects outward from a lateral surface 30c of the sealing resin body 30. The main terminal 80 has a bent in a middle of the portion covered by the sealing resin body 30, and projects from the vicinity of the center in the Z direction on the lateral surface 30c.

The main terminal 81 is electrically connected to the collector electrode 43 via the heat sink 60. The main terminal 81 connects to one end of the heat sink 60 in the Y direction. The main terminal 81 has a thickness smaller than that of the heat sink 60. The main terminal 81 connects to the heat sink 60 so as to be substantially flush with the facing surface 60a, for example. The main terminal 81 and the heat sink 60 may be provided by an integral member, so that the main terminal 81 connects to the heat sink 60. Alternatively, the main terminal 81 and the heat sink 60 may be provided by separate members, and be connected to each other so that the main terminal 81 connects to the heat sink 60.

In the present embodiment, the main terminal 81 is provided integrally with the heat sink 60 as a part of a lead frame separate from the lead frame of the main terminal 80. The main terminal 81 extends from the heat sink 60 in the Y direction, and projects outward from the same lateral surface 30c as the main terminal 80. The main terminal 81 also has a bent in a middle of the portion covered by the sealing resin body 30, and projects from the vicinity of the center in the Z direction on the lateral surface 30c. The two main terminals 80 and 81 are arranged side by side in the X direction.

The signal terminals 82 are electrically connected to the pads 44 of the semiconductor element 40. In the present embodiment, the signal terminal 82 is connected to the pad 44 via a bonding wire 91. The signal terminal 82 extends in the Y direction, and projects outside from a lateral surface 30d of the sealing resin body 30. The lateral surface 30d is a surface opposite to the lateral surface 30c in the Y direction. The semiconductor device 20 of the present embodiment includes five signal terminals 82 corresponding to the five pads 44. For example, the signal terminals 82 are formed in the lead frame common to the heat sink 60 and the main terminal 81. The signal terminals 82 are electrically separated from each other by cutting a tie bar (not shown).

As described above, in the semiconductor device 20, the semiconductor element 40 constituting one arm is sealed by the sealing resin body 30. The sealing resin body 30 integrally seals the semiconductor element 40, a part of the heat sink 50, a part of the heat sink 60, the terminal member 70, a part of each of the main terminals 80 and 81, and a part of each of the signal terminals 82.

In the Z direction, the semiconductor element 40 is arranged between the heat sinks 50 and 60. The semiconductor element 40 is interposed between the heat sinks 50 and 60 that are arranged so as to face each other. As a result, the heat of the semiconductor element 40 can be dissipated from both sides in the Z direction. The semiconductor device 20 has a double-sided heat dissipation structure. The back surface 50b of the heat sink 50 is substantially coplanar with the front surface 30a of the sealing resin body 30. The back surface 60b of the heat sink 60 is substantially coplanar with the back surface 30b of the sealing resin body 30. Since the back surfaces 50b and 60b are exposed surfaces, heat dissipation can be improved.

<Semiconductor Element>

Figure 4:
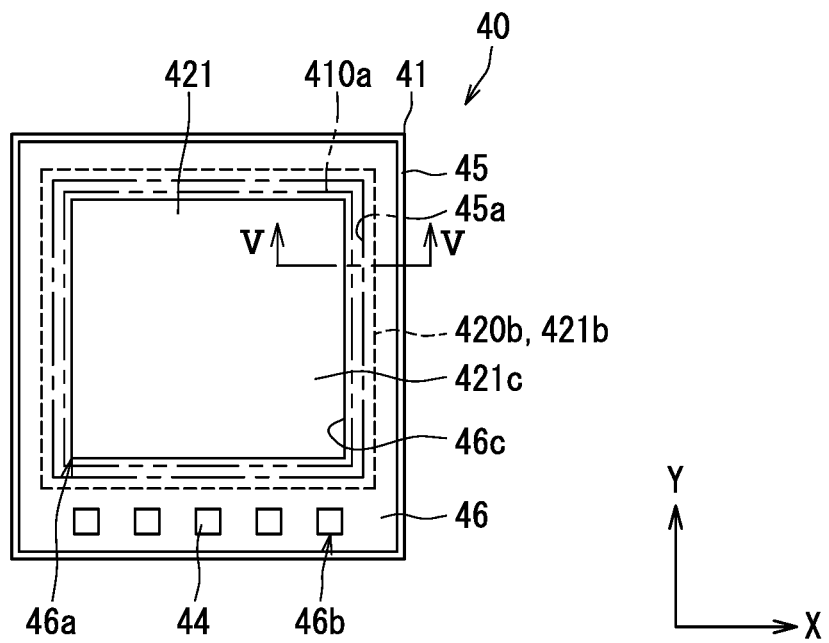
FIG. 4 is a diagram illustrating a plan view of a semiconductor element according to the first embodiment.
Figure 5:
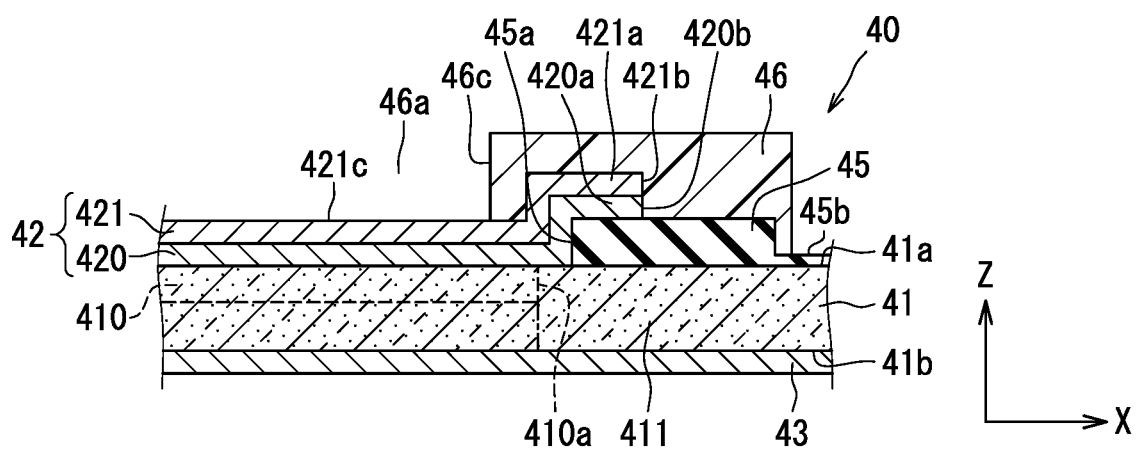
FIG. 5 is a diagram illustrating a cross-sectional view taken along a line V-V in FIG. 4.

Next, the semiconductor element 40 will be described with reference to FIGS. 4 and 5. FIG. 4 is a plan view of the semiconductor element 40 when viewed from the front surface side. In FIG. 4, an outer peripheral edge 420b of a base electrode 420 and an outer peripheral edge 421b of a connection electrode 421 are indicated by broken lines, and an inner peripheral edge 45a of a silicon oxide film 45 is indicated by an alternate long and short dash line. Further, an outer peripheral edge 410a of an active region 410, that is, the boundary between an active region 410 and an outer peripheral region 411 is indicated by a two-dot chain line. FIG. 5 is a cross-sectional view taken along a line V-V in FIG. 4. In the following descriptions, "inside" and "outside" indicate relative positional relationships with the center of the active region 410 of the semiconductor element 40 as a reference position. The area closer to the center is the inside, and the area farther from the center is the outside.

The semiconductor substrate 41 has a substantially rectangular shape in a plan view. The semiconductor substrate 41 has the active region 410 in a surface layer adjacent to the front surface 41a. The active region 410 is a region where an element is formed, and will also be referred to as an element formation region. The active region 410 will also be referred to as a main region. Although not shown, the active region 410 is formed with a part of the RC-IGBT adjacent to the front surface 41a. For example, in the active region 410, a trench gate of the IGBT 11, a base region, an emitter region, and an anode region of the FWD 12 are formed. In FIG. 5, the active region 410 is shown by a broken line.

The semiconductor substrate 41 has an outer peripheral region 411 that surrounds the active region 410. In FIG. 5, the boundary between the active region 410 and the outer peripheral region 411 is indicated by an alternate long and short dash line. The outer peripheral region 411 is a region outside the outer peripheral edge 410a of the active region 410 in a plan view. Although not shown, a voltage withstand structural part, such as a guard ring, is formed in the outer peripheral region 411.

In the semiconductor substrate 41, a collector region of the IGBT 11 and a cathode region of the FWD 12 are formed in a surface layer adjacent to the back surface 41b. The back surface 41b is opposite to the front surface 41a in the Z direction. The collector electrode 43 is formed on substantially the entire back surface 41b of the semiconductor substrate 41.

The semiconductor element 40 further includes a silicon oxide film 45 and a protective film 46. The silicon oxide film 45 is an interlayer insulating film formed on the front surface 41a of the semiconductor substrate 41. The silicon oxide film 45 is provided in a loop shape so as to surround the active region 410. The silicon oxide film 45 is formed in the outer peripheral region 411 on the front surface 41a. The silicon oxide film 45 has a contact hole for connecting the emitter electrode 42 to the semiconductor substrate 41. An end surface of the silicon oxide film 45 provides an opening end 45a and defines the contact hole. The opening end 45a is located more to outside than the outer peripheral edge 410a of the active region 410. An in-film residual stress of the silicon oxide film 45 is a compressive stress.

In the present embodiment, the silicon oxide film 45 extends more to the outside than an outer peripheral edge of the protective film 46. The silicon oxide film 45 has an exposed portion 45b exposed from the protective film 46. The exposed portion 45b includes a scribe region. The silicon oxide film 45 is formed on the front surface 41a of the semiconductor substrate 41 in almost the entire area excluding a connecting portion (contact) of the emitter electrode 42, that is, almost the entire area excluding the portion exposed from the contact hole.

The emitter electrode 42 has a multi-layer structure. The emitter electrode 42 has a base electrode 420 and a connection electrode 421. The pad 44 also has the similar configuration to the emitter electrode 42.

The base electrode 420 is a metal layer formed adjacent to the semiconductor substrate 41, in the emitter electrode 42 having the multi-layer structure. The base electrode 420 may also be referred to as a lower electrode, a lower layer electrode, a wiring electrode, a first metal layer, or the like. The base electrode 420 is connected to the front surface 41a of the semiconductor substrate 41 and the silicon oxide film 45. The base electrode 420 has a higher adhesion to the silicon oxide film 45 than the connection electrode 421. The base electrode 420 is formed by using, for example, a material containing aluminum (Al) as a main component. In the present embodiment, the material is an Al alloy such as AlSi or AlSiCu.

The base electrode 420 extends up to a position above the outer peripheral region 411 while including the active region 410 in a plan view. The base electrode 420 is connected to the emitter region, the base region, and the anode region. The peripheral end portion 420a of the base electrode 420 is stacked and arranged on the silicon oxide film 45. The peripheral end portion 420a is arranged on the peripheral portion of the opening end 45a of the silicon oxide film 45. The peripheral end portion 420a has a loop shape in the plan view, and is arranged above the outer peripheral region 411. The outer peripheral edge 420b of the base electrode 420 is located on the silicon oxide film 45.

The connection electrode 421 is stacked and arranged on the base electrode 420 for the purpose of improving the bonding strength with the solder 90 and improving the wettability with respect to the solder 90. The connection electrode 421 may also be referred to as a cover electrode, an upper electrode, an upper layer electrode, and a second metal layer. The connection electrode 421 includes at least one metal layer. The metal layer constituting the connection electrode 421 contains a material having a lower adhesion to the silicon oxide film 45 than the base electrode 420, and the material includes at least one from Ni, Pd, Au, Pt, and Ag, for example. The in-film residual stress of the connection electrode 421 is a tensile stress.

The connection electrode 421 of the present embodiment includes at least a nickel (Ni) layer. Ni is harder than the Al alloy forming the base electrode 420. The connection electrode 421 may further include a gold (Au) layer on the Ni layer. For example, the Au layer suppresses oxidation of the Ni layer, and thus improves the wettability with the solder. Since Au diffuses into the solder during soldering, the Au layer exists in the state before soldering, but does not exist in the solder-connected state.

Similarly to the base electrode 420, the connection electrode 421 extends above the outer peripheral region 411 while including the active region 410 in a plan view. The peripheral end portion 421a of the connection electrode 421 is stacked and arranged on the peripheral end portion 420a of the base electrode 420. The peripheral end portion 421a is arranged on the silicon oxide film 45 via the peripheral end portion 420a. The peripheral end portion 421a has a loop shape in the plan view and is arranged above the outer peripheral region 411. The outer peripheral edge 421b of the connection electrode 421 is located on the silicon oxide film 45. The peripheral end portion 420a corresponds to a first peripheral end portion, and the peripheral end portion 421a corresponds to a second peripheral end portion.

In the present embodiment, the connection electrode 421 is arranged so as to substantially coincide with the base electrode 420 in a plan view. The positions of the outer peripheral edge 420b and 421b substantially coincide with each other on the entire perimeter. The outer peripheral edges 420b and 421b are located more to outside than the opening end 45a of the silicon oxide film 45.

The protective film 46 is an insulating film provided on the front surface 41a of the semiconductor substrate 41 so as to cover the peripheral end portion of the emitter electrode 42 and the silicon oxide film 45. As the material of the insulating film, for example, polyimide, silicon nitride film, or the like can be used. The protective film 46 has an opening 46a that defines a connection area between the emitter electrode 42 and the solder 90. The opening 46a allows the emitter electrode 42 to expose so as to enable the solder bonding with the solder 90. The protective film 46 has an opening 46b that provides a connection area for the pad 44. Each of the openings 46a and 46b is a through hole that penetrates the protective film 46 in the Z direction. Of the emitter electrode 42 (connection electrode 421), the exposed portion 421c exposed from the opening 46a of the protective film 46 forms a bonding portion with the solder 90.

In the present embodiment, the protective film 46 is made of polyimide. The protective film 46 covers the peripheral end portion 420a of the base electrode 420 and the peripheral end portion 421a of the connection electrode 421. The protective film 46 covers the portion of the silicon oxide film 45 excluding the exposed portion 45b. The protective film 46 is not provided in the scribe region that is in a predetermined region from the outer peripheral edge of the semiconductor substrate 41. The shape of the opening 46a, that is, the shape of the opening end 46c of the protective film 46 defining the opening 46a is substantially a rectangle in the plan view. The opening end 46c may also be referred to as an inner peripheral edge. The opening end 46c is located more to inside than the outer peripheral end 410a of the active region 410.

<Manufacturing Method for Semiconductor Element>

Figure 6:
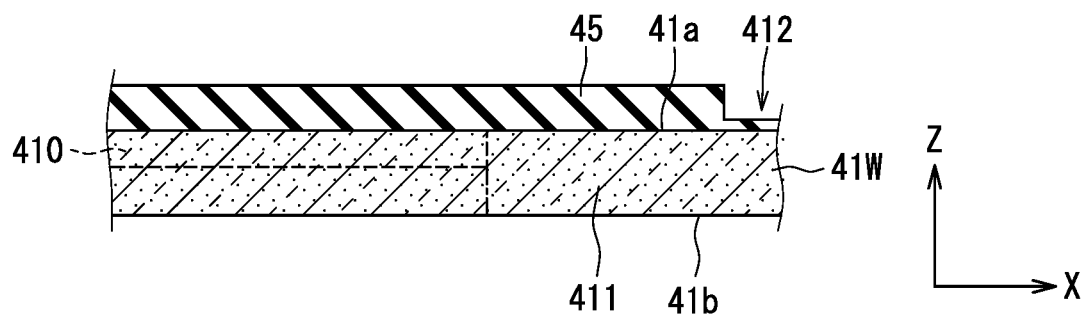
FIG. 6 is a diagram illustrating a cross-sectional view for explaining a method for manufacturing the semiconductor element.
Figure 7:
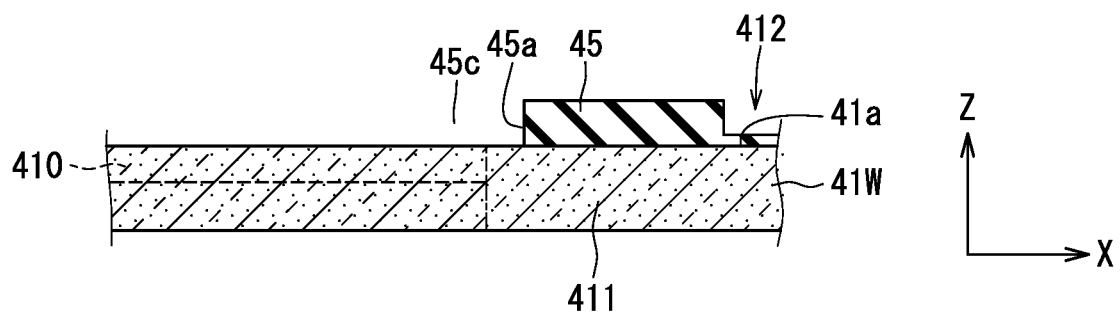
FIG. 7 is a diagram illustrating a cross-sectional view for explaining the method for manufacturing the semiconductor element.
Figure 8:
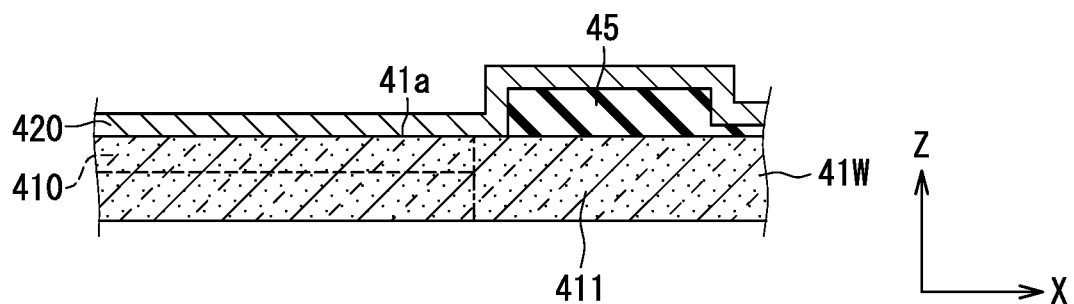
FIG. 8 is a diagram illustrating a cross-sectional view for explaining the method for manufacturing the semiconductor element.
Figure 9:
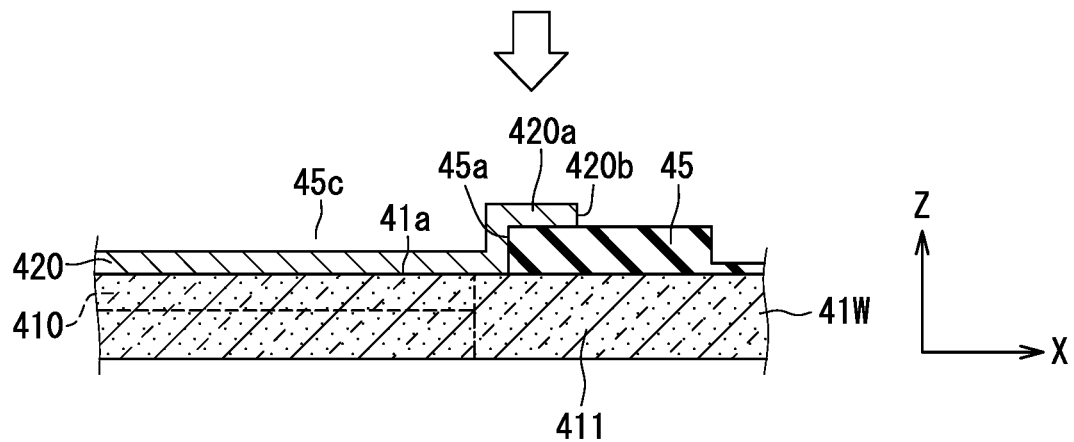
FIG. 9 is a diagram illustrating a cross-sectional view for explaining the method for manufacturing the semiconductor element.
Figure 10:
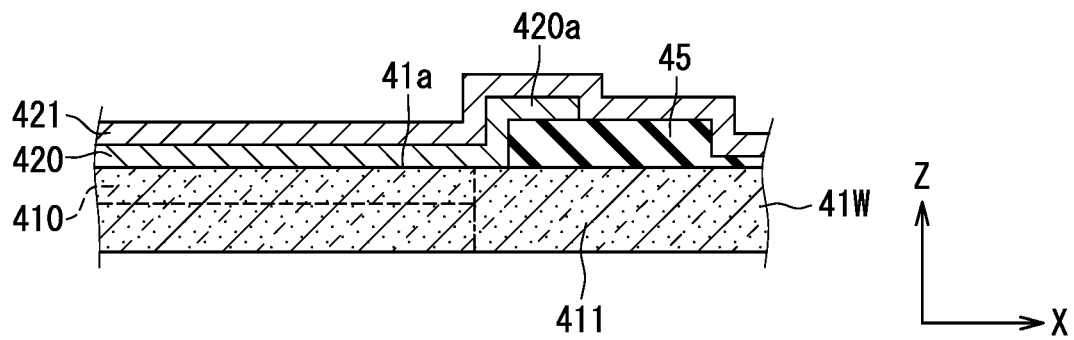
FIG. 10 is a diagram illustrating a cross-sectional view for explaining the method for manufacturing the semiconductor element.
Figure 11:
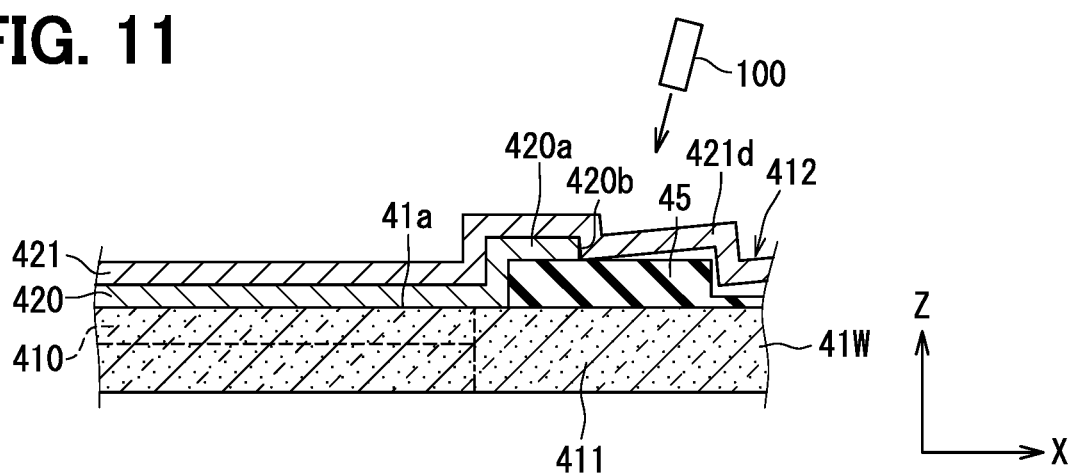
FIG. 11 is a diagram illustrating a cross-sectional view for explaining the method for manufacturing the semiconductor element.
Figure 12:
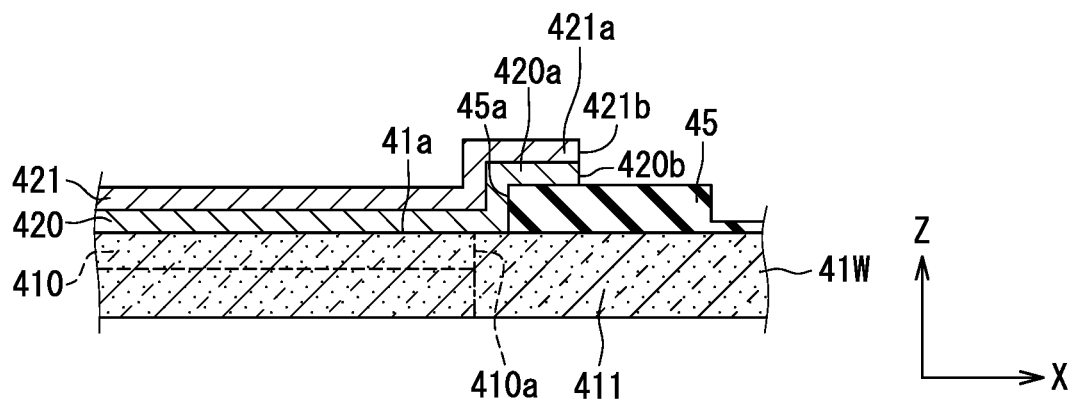
FIG. 12 is a diagram illustrating a cross-sectional view for explaining the method for manufacturing the semiconductor element.
Figure 13:
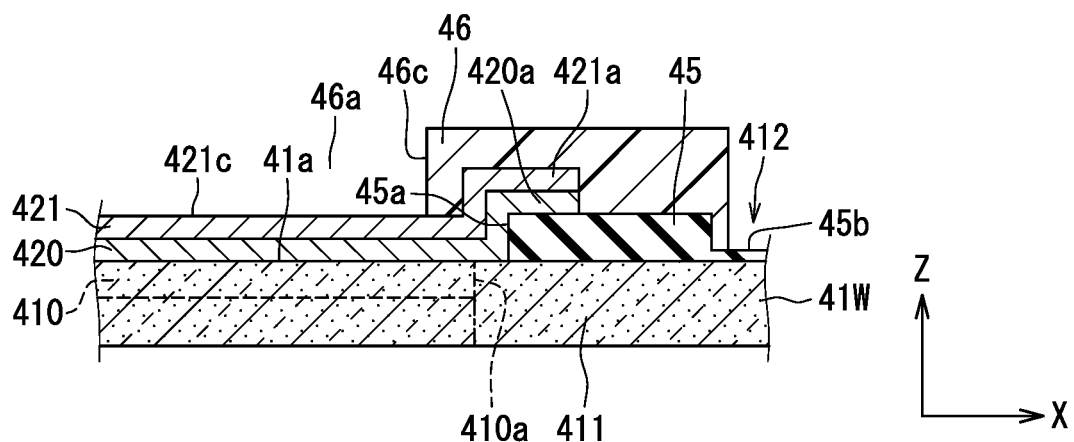
FIG. 13 is a diagram illustrating a cross-sectional view for explaining the method for manufacturing the semiconductor element.
Figure 14:
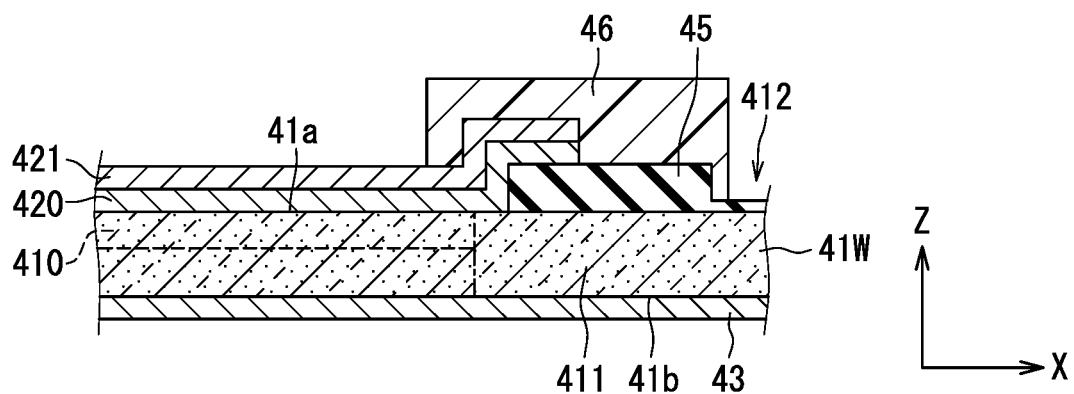
FIG. 14 is a diagram illustrating a cross-sectional view for explaining the method for manufacturing the semiconductor element.

Next, a method for manufacturing a semiconductor device, specifically, a method for manufacturing a semiconductor element will be described with reference to FIGS. 6 to 14. FIGS. 6 to 14 are cross-sectional views showing a manufacturing process of the semiconductor element, corresponding to FIG. 5. FIG. 6 shows a step of film-forming a silicon oxide film, and FIG. 7 shows a step of patterning the silicon oxide film. FIG. 8 shows a step of film-forming a base electrode, and FIG. 9 shows a step of patterning the base electrode. FIG. 10 shows a step of film-forming a connection electrode, and FIGS. 11 and 12 show a step of patterning the connection electrode. FIG. 13 shows a step of forming a protective film, and FIG. 14 shows a step of forming a collector electrode.

First, an element (RC-IGBT) is formed in a semiconductor substrate in a wafer state by ion implantation or the like. Hereinafter, the semiconductor substrate in the wafer state is referred to as a semiconductor wafer. Then, as shown in FIG. 6, a silicon oxide film 45 is formed by a CVD technique, for example. In this case, the silicon oxide film 45 is formed so as to cover the entirety of a front surface 41a of a semiconductor wafer 41W. Therefore, the silicon oxide film 45 is also formed on the scribe region 412 of the semiconductor wafer 41W. Considering dicing, the thickness of the silicon oxide film 45 may be made thinner in the scribe region 412 than in other regions. The silicon oxide film 45 may be formed by a CVD technique as well as a thermal oxidation technique. The scribe region 412 may also be referred to as a scribe line.

Next, as shown in FIG. 7, the silicon oxide film 45 is patterned. For example, a photoresist is applied to the surface of the silicon oxide film 45 and patterned by exposure, and etching is performed using the photoresist as a mask, to thereby pattern the silicon oxide film 45. Specifically, a contact hole 45c for connecting the emitter electrode 42 to the semiconductor wafer 41W is formed in the silicon oxide film 45. In this case, the contact hole 45c is formed so as to include the active region 410 in a plan view.

In this way, of the silicon oxide film 45, the portion corresponding to the contact portion of the emitter electrode 42 is removed, and the other portion is left. In the outer peripheral region 411, the silicon oxide film 45 is intentionally left not only in an area where the patterned base electrode 420 is stacked thereon but also in an area outside of the stacked area.

Next, as shown in FIG. 8, the base electrode 420 (Al alloy film) is formed into a film by, for example, a sputtering technique or a vapor deposition technique. In this case, the base electrode 420 is formed entirely on the front surface 41a so as to cover the silicon oxide film 45.

Next, as shown in FIG. 9, the base electrode 420 is patterned. For example, a photoresist is applied to the surface of the base electrode 420 and patterned by exposure, and etching is performed using the photoresist as a mask, to thereby pattern the base electrode 420. As a result, the portion of the base electrode 420 inside the outer peripheral edge 420b described above is left. That is, the portion inside the opening end 45a of the silicon oxide film 45 and the peripheral end portion 421a stacked on the silicon oxide film 45 are left.

After the base electrode 420 is formed, plasma treatment may be performed as a pretreatment for forming the connection electrode 421. Specifically, a fluorine-based gas such as $CF_4$ is used as the gas for the plasma treatment. Then, as shown by an arrow in FIG. 9, the fluorine-based gas is sprayed onto the surface of the base electrode 420 and the surface of the silicon oxide film 45 exposed from the base electrode 420. As a result, after removing the oxide film on the surface of the base electrode 420, fluorine is adhered to the surfaces of the base electrode 420 and the silicon oxide film 45 to form a fluoride layer (not shown).

By continuously forming the fluoride layer in a vacuum, most of the oxygen on the base electrode 420 is replaced with fluorine, and fluorine and oxygen are mixed and present on the base electrode 420. On the other hand, a layer having a high concentration of fluorine is formed on the surface of the silicon oxide film 45. As the gas for the plasma treatment, oxygen gas may be used together with the fluorine-based gas. The use of oxygen gas can extend the life of fluorine radicals.

Next, as shown in FIG. 10, the connection electrode 421 (Ni film) is formed into a film by, for example, a sputtering technique or a thin-film deposition technique. In this case, the base electrode 420 is formed entirely on the front surface 41a so as to cover the base electrode 420 and the silicon oxide film 45.

Next, as shown in FIG. 11, the connection electrode 421 is patterned. In FIG. 11, a nozzle 100 is scanned along the front surface 41a to spray water toward the connection electrode 421. The nozzle 100 is scanned to spray water over the entirety of the front surface 41a. In this case, the pressure of the water (water pressure) is set within a range in which the connection electrode 421 can be peeled off from the silicon oxide film 45, and the semiconductor wafer 41W, the base electrode 420, and the connection electrode 421 on the base electrode 420 are not damaged. For example, the water pressure is set in the range of 0.2 to 20 MPa.

The connection electrode 421 (Ni layer) has a lower adhesion to the silicon oxide film 45 than the base electrode 420 (Al alloy layer). Further, since the metal used for the electrode material has a larger coefficient of linear expansion than that of the substrate (for example, Si), the residual stress in the film of the base electrode 420 and the connection electrode 421 is both tensile stress. On the other hand, since silicon dioxide has a smaller coefficient of linear expansion than the substrate (Si), the residual stress in the film of the silicon oxide film 45 is a compressive stress. Since the connection electrode 421 has the lower adhesion to the silicon oxide film 45 as well as there is the stress difference, the portion 421d of the connection electrode 421 that is stacked directly on the silicon oxide film 45 is peeled off from the silicon oxide film 45 as the water is sprayed.

In the present embodiment, in particular, the pretreatment (plasma treatment) is performed as described above. For example, when the connection electrode 421 is formed by the sputtering technique, the fluorine in the fluoride layer on the base electrode 420 moves to the connection electrode 421 due to the heat generated during the film formation. Since the base electrode 420 and the connection electrode 421 are metal-bonded, the connection electrode 421 has a higher adhesion to the base electrode 420. Therefore, even if the water is sprayed, the connection electrode 421 is not easily peeled off from the base electrode 420.

On the other hand, in the fluorine layer on the surface layer of the silicon oxide film 45, a portion having a weak binding force is generated. Therefore, the connection electrode 421 has a lower adhesion to the silicon oxide film 45. For this reason, when the water is sprayed, the bonding between carbon and fluorine is broken, so that the connection electrode 421 (portion 421d) is easily peeled off from the silicon oxide film 45 together with the fluorine layer.

As described above, the connection electrode 421 on the silicon oxide film 45 is removed by utilizing the difference in the adhesion of the connection electrode 421 to the base electrode 420 and the silicon oxide film 45, and thus the connection electrode 421 is patterned as shown in FIG. 12. The connection electrode 421 on the base electrode 420 remains, and thus the connection electrode 421 has the arrangement of substantially coinciding with the base electrode 420 in the plan view. The peripheral end portion 421a of the connection electrode 421 is stacked and arranged on the peripheral end portion 420a of the base electrode 420, and the outer peripheral edge 421b substantially coincides with the outer peripheral edge 420b.

Next, as shown in FIG. 13, a protective film 46 is formed. For example, a liquid polyimide is applied onto the front surface 41a of the semiconductor wafer 41W and spin-coated to form the protective film 46 entirely over the front surface 41a. Then, a photoresist is applied to the surface of the protective film 46 and patterned by exposure, and etching is performed using the photoresist as a mask to pattern the protective film 46. As a result, the openings 46a and 46b are formed in the protective film 46. Further, the scribe region 412 is opened to partition a plurality of semiconductor elements formed on the semiconductor wafer 41W. By opening the scribe region 412, the portion 45b of the silicon oxide film 45 is exposed as the exposed portion.

Next, as shown in FIG. 14, a collector electrode 43 is formed on a back surface 41b of the semiconductor wafer 41W by, for example, a sputtering technique. Then, the semiconductor wafer 41W is diced along the scribe region 412 to be individualized into chips, although not shown. In this way, the semiconductor element 40 as described above can be produced.

Summary of First Embodiment

Figure 15:
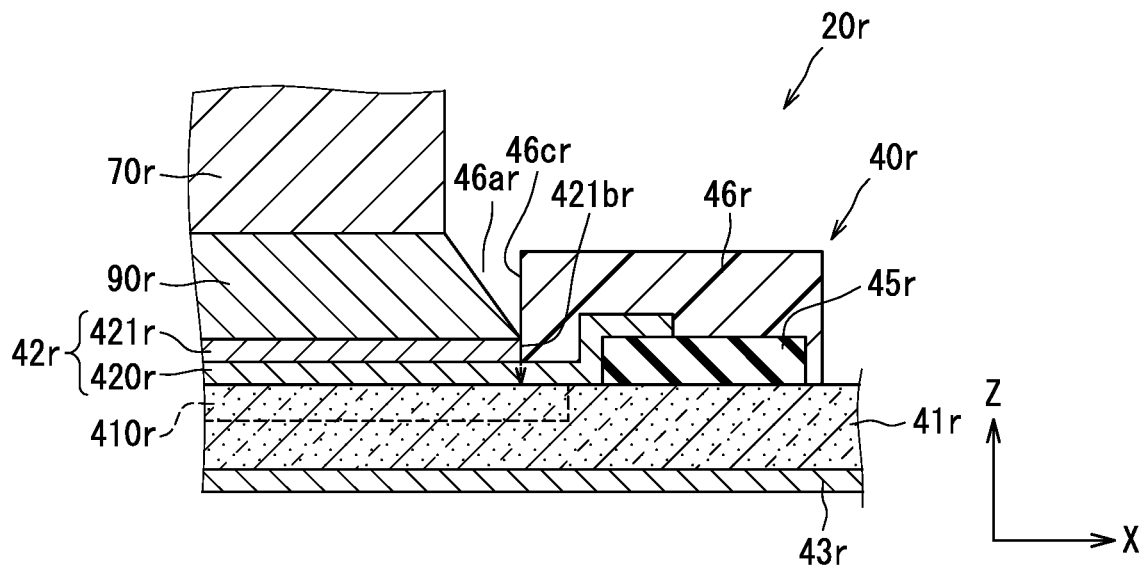
FIG. 15 is a diagram illustrating a cross-sectional view of a semiconductor device as a reference example.

FIG. 15 is a cross-sectional view showing a reference example. In the reference example, the elements identical or related to the present embodiment are denoted by adding "r" to the tails of the reference numbers in the present embodiment. FIG. 15 shows a solder connection structure between an emitter electrode 42r and a terminal member 70r.

Also in a semiconductor device 20r of the reference example, similarly to the present embodiment, the emitter electrode 42r of the semiconductor element 40r has a base electrode 420r and a connection electrode 421r. The connection electrode 421r is provided on the surface of the portion of the base electrode 420r that exposes from an opening 46ar of the protective film 46r. The connection electrode 421r is arranged only in the opening 46ar and is not covered by the protective film 46r. An outer peripheral edge 421br of the connection electrode 421 is in contact with an opening end 46cr of the protective film 46r. The connection electrode 421r includes, for example, a plating film. The connection electrode 421r is formed after the protective film 46r is formed so as to cover the base electrode 420r and patterned to form the opening 46ar.

In the semiconductor element 40r, a boundary (interface) between the protective film 46r and the connection electrode 421r is located above the base electrode 420r. An active region 410r exists directly under the boundary. In such a configuration, thermal stress due to such as a power cycle or a cold cycle is concentrated in a portion directly under the boundary, that is, a portion directly under the outer peripheral edge 421br, as shown by the broken line arrow. Therefore, a crack is likely to occur in the portion of the base electrode 420r directly under the boundary. The crack may grow to the active region 410r existing directly under the boundary. The thermal stress is generated due to the difference in linear expansion coefficient between the semiconductor element 40r (semiconductor substrate 41r) and the metal member such as the terminal member 70r. In this case, "directly under" means that a position of a lower element coincides with an upper element in the Z direction, does not necessarily mean that the lower element is in direct contact with the upper element.

In particular, in the configuration of the reference example, the outer peripheral end of the solder 90r substantially coincides with the opening end 46cr of the protective film 46r. That is, the boundary between the solder 90r and the protective film 46r substantially coincides with the boundary between the connection electrode 421r and the protective film 46r. As a result, the positions of the outer peripheral edge 421br, the open end 46cr, and the outer peripheral end of the solder 90r overlap each other in the plan view, that is, in the Z direction, so that the thermal stress is more concentrated in the portion directly under the boundary.

Figure 16:
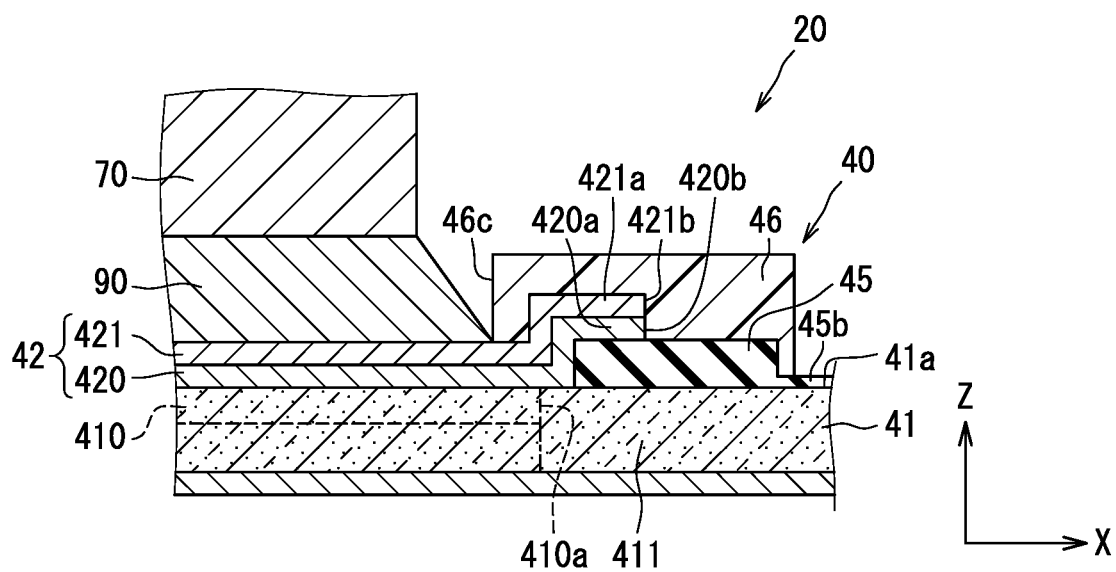
FIG. 16 is a diagram illustrating a cross-sectional view of the semiconductor device for showing a solder-connected structure between the semiconductor element and a terminal member according to the first embodiment.

FIG. 16 shows the semiconductor device 20 of the present embodiment. FIG. 16 shows the solder connection structure between the semiconductor element 40 and the terminal member 70 for the convenience. FIG. 16 corresponds to FIG. 15. As shown in FIG. 16, the connection electrode 421 extends up to a position overlapping the outer peripheral region 411 in the plan view, that is, in the Z direction. The peripheral end portion 421a of the connection electrode 421 is covered with the protective film 46. In the plan view, the outer peripheral edge 421b of the connection electrode 421, that is, a boundary (interface) between the outer peripheral edge 421b and the protective film 46 is provided at a position overlapping the outer peripheral region 411 of the semiconductor substrate 41. That is, the boundary between the outer peripheral edge 421b and the protective film 46 is located at a position corresponding to the outer peripheral region 411 of the semiconductor substrate 41 in the Z direction.

In this way, the boundary between the outer peripheral edge 421b and the protective film 46 is provided at a position away from the active region 410 in the plan view. Therefore, even if thermal stress due to such as a power cycle or a cold/heat cycle is concentrated in a portion directly under the boundary, cracks are unlikely to develop into the active region 410. Accordingly, it is possible to suppress the active region 410 from being damaged by the thermal stress.

In the present embodiment, the position of the boundary between the outer peripheral edge 421b of the connection electrode 421 and the protective film 46 is shifted outward with respect to the position of the boundary between the solder 90 and the protective film 46. As a result, the thermal stress is dispersed. Therefore, it is possible to reduce the thermal stress acting directly under the boundary between the outer peripheral edge 421b and the protective film 46.

Figure 17:
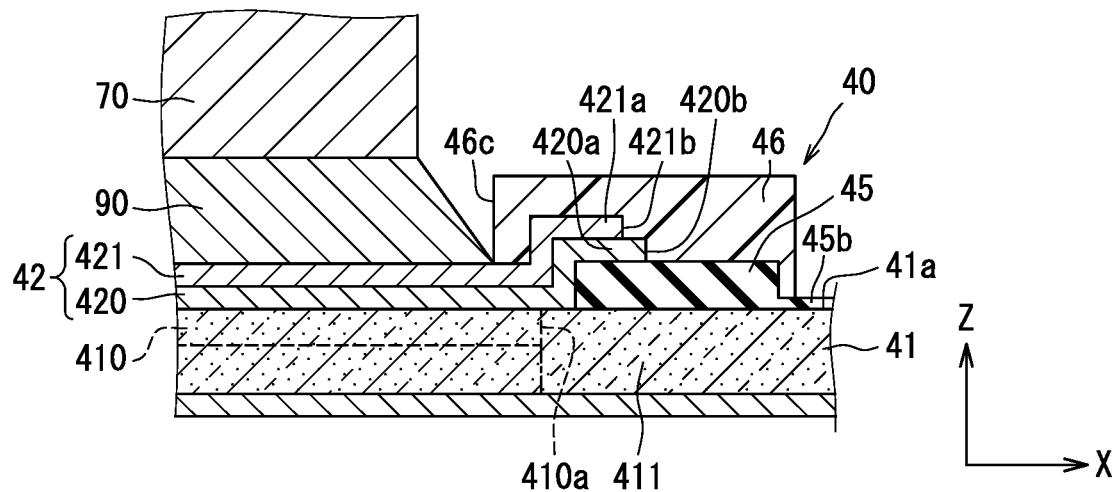
FIG. 17 is a diagram illustrating a cross-sectional view of a semiconductor device as a modification.

The position of the outer peripheral edge 421b of the connection electrode 421 can be set within a range overlapping with the outer peripheral region 411. For example, as in a modification shown in FIG. 17, the position of the outer peripheral edge 421b may be shifted with respect to the outer peripheral edge 420b of the base electrode 420. FIG. 17 is a cross-sectional view of the modification and corresponds to FIG. 16. The outer peripheral edge 421b is located more to inside than the outer peripheral edge 420b. The boundary between the outer peripheral edge 421b and the protective film 46 is provided at a position away from the active region 410 in the plan view. Therefore, it is possible to restrict the active region 410 from being damaged by thermal stress.

On the other hand, in the present embodiment, the connection electrode 421 is arranged so as to substantially coincide with the base electrode 420 in the plan view. The positions of the outer peripheral edges 420b and 421b substantially coincide with each other on the entire perimeter. In this configuration, the base electrode 420 does not exist directly under the boundary between the outer peripheral edge 421b and the protective film 46. Therefore, it is possible to suppress the occurrence of cracks in the portion of the base electrode 420 directly under the boundary due to the concentration of the thermal stress. The silicon oxide film 45 exists directly under the boundary. Even if the thermal stress is concentrated on the portion of the silicon oxide film 45 directly under the boundary, the silicon oxide film 45 is a brittle material and does not undergo plastic fracture due to repetition. Therefore, it is possible to restrict the semiconductor substrate 41 from being damaged by the thermal stress.

In the present embodiment, the silicon oxide film 45 is formed entirely over the front surface 41a of the semiconductor wafer 41W except for the portion to which the emitter electrode 42 is connected. Then, the portion of the connection electrode 421 on the silicon oxide film 45 is removed by utilizing the difference in the adhesion of the connection electrode 421 to the base electrode 420 and the silicon oxide film 45 and the difference in the in-film residual stress, whereas the portion of the connection electrode 421 on the base electrode 420 is left. When the connection electrode 421 is peeled off from any place on the silicon oxide film 45, the connection electrode 421 can be peeled off from the silicon oxide film 45 from the peeled place as a starting point while the connection electrode 421 on the silicon oxide film 45 is kept in a connected state. Therefore, the connection electrode 421 can be patterned without using a resist.

In the present embodiment, in particular, the plasma treatment is performed after the base electrode 420 is formed and before the connection electrode 421 is formed. The fluorine-based gas is used in the plasma treatment. As a result, after removing the oxide film on the surface of the base electrode 420, fluorine is adhered to the surfaces of the base electrode 420 and the silicon oxide film 45 to form a fluoride layer on the surfaces of the base electrode 420 and the silicon oxide film 45. Due to the formation of the fluorine layer, the difference in adhesion with the connection electrode 421 becomes larger, and the connection electrode 421 on the silicon oxide film 45 can be easily peeled off.

When the connection electrode 421 (Ni layer) on the silicon oxide film 45 is peeled off, water may be sprayed while rotating a substantially disk-shaped semiconductor wafer 41W about its central axis. As a result, the water can be applied substantially uniformly over the front surface 41a of the semiconductor wafer 41W. In this way, spin cleaning may be used.

In place of the water, other liquids (e.g., organic solvent) may be used. In place of the water, gas such as air may be sprayed. With the pressure of a liquid or gas, the portion of the connection electrode 421 having the lower adhesion can be peeled off.

Further, the connection electrode 421 on the silicon oxide film 45 may be peeled off by wet cleaning. In this case, an etching solution containing sulfuric acid, for example, sulfuric acid hydrogen peroxide, may be used. The sulfuric acid hydrogen peroxide is a mixed solution of sulfuric acid and hydrogen peroxide.

Second Embodiment

A second embodiment is a modification of the preceding embodiment as a basic configuration and may incorporate the description of the preceding embodiment. In the preceding embodiment, the boundary between the solder 90 and the protective film 46, that is, the opening end 46c of the protective film 46 is provided at a position overlapping the active region 410, that is, a position corresponding to the active region 410 in the Z direction. Alternatively, the opening end 46c of the protective film 46 may be located more to outside than the active region 410.

Figure 18:
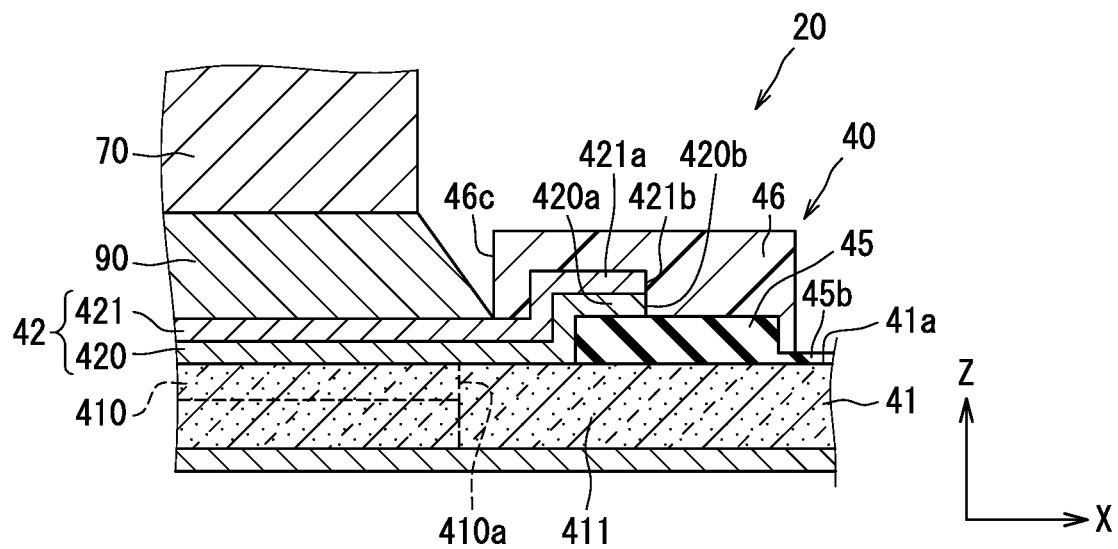
FIG. 18 is a diagram illustrating a cross-sectional view of a semiconductor device according to a second embodiment.

FIG. 18 is a cross-sectional view of a semiconductor device 20 according to the present embodiment. FIG. 18 also shows a solder connection structure between the semiconductor element 40 and the terminal member 70, as in FIG. 16. The opening end 46c of the protective film 46 is located more to outside than the outer peripheral edge 410a of the active region 410 in the plan view. The opening end 46c is located at a position overlapping the outer peripheral region 411, that is, at a position corresponding to the outer peripheral region 411 in the Z direction. As a result, directly under the boundary between the solder 90 and the protective film 46, the active region 410 does not exist, but the outer peripheral region 411 exists. The other configurations are similar to those of the preceding embodiment (for example, see FIG. 16).

Summary of Second Embodiment

As described above, the thermal stress due to such as power cycle or cold cycle is also concentrated on the boundary between the solder 90 and the protective film 46. In the present embodiment, in addition to the boundary between the outer peripheral edge 421b of the connection electrode 421 and the protective film 46, the boundary between the solder 90 and the protective film 46 is also located at the position overlapping the outer peripheral region 411. Therefore, it is possible to more effectively suppress damage to the active region 410 due to thermal stress.

Since the boundary between the solder 90 and the protective film 46 is provided outside the active region 410 in the planar direction, the size of the semiconductor element 40 increases in the direction orthogonal to the Z direction. According to the configuration described in the preceding embodiment, it is possible to suppress damage to the active region 410 due to thermal stress while reducing the size of the semiconductor element 40.

The configuration of the present embodiment can be combined with the modification shown in the preceding embodiment.

Third Embodiment

The present embodiment is a modification of the preceding embodiments as a basic configuration and may incorporate the description of the preceding embodiments. In the preceding embodiment, the connection electrode 421 has a single-layer structure. Alternatively, the connection electrode 421 may have a multi-layer structure.

Figure 19:
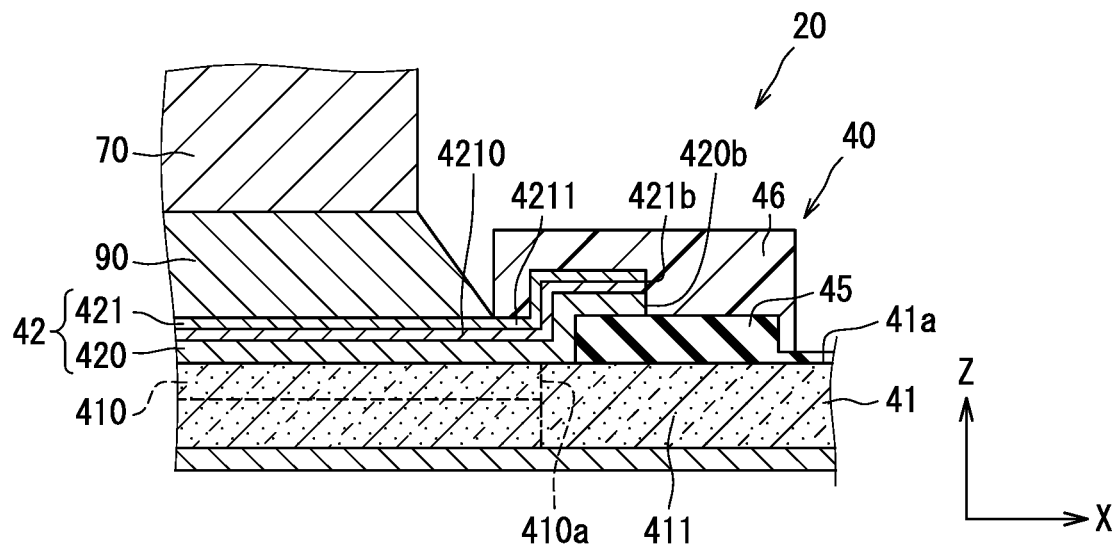
FIG. 19 is a diagram illustrating a cross-sectional view of a semiconductor device according to a third embodiment.

FIG. 19 is a cross-sectional view of a semiconductor device 20 according to the present embodiment. FIG. 19 also shows a solder connection structure between the semiconductor element 40 and the terminal member 70, as in FIG. 16. The connection electrode 421 has a two-layer structure. The connection electrode 421 has a lower layer 4210 which is a layer in contact with the base electrode 420 and an upper layer 4211 which is a layer in contact with the solder 90.

The lower layer 4210 is a layer made of a metal having a lower adhesion to the silicon oxide film 45 than the base electrode 420. The lower layer 4210 has a higher adhesion to the base electrode 420 and the upper layer 4211 than to the silicon oxide film 45. The upper layer 4211 is a layer made of a metal having better solderability than the lower layer 4210. In the present embodiment, a platinum (Pt) layer is used as the lower layer 4210, and a Ni layer is used as the upper layer 4211. The lower layer 4210 (Pt) also functions as a barrier layer against alloy formation of the solder 90 with Sn. The lower layer 4210 and the upper layer 4211 are formed by a sputtering technique and a vapor deposition technique. The other configurations are similar to those of the preceding embodiment (for example, see FIG. 16).

Summary of Third Embodiment

In the present embodiment, the connection electrode 421 has the multi-layer structure. The lower layer 4210 of the connection electrode 421 has a low adhesion to the silicon oxide film 45, and the upper layer 4211 has excellent bondability with the solder 90. Therefore, the connection electrode 421 on the silicon oxide film 45 can be easily peeled off while ensuring high bonding strength. Although Pt is a hard material that is difficult to etch, the lower layer 4210 on the silicon oxide film 45 as well as the upper layer 4211 can be removed by utilizing the difference in the adhesion of the lower layer 4210 to the base electrode 420 and the silicon oxide film 45. Therefore, the connection electrode 421 on the base electrode 420 can be left.

An example in which the lower layer 4210 is a Pt layer and the upper layer 4211 is a Ni layer is described hereinabove. However, the lower layer 4210 and the upper layer 4211 are not limited to such an example. For example, the lower layer 4210 may be a Pd layer. The Pd layer also functions as a barrier layer. Further, the lower layer 4210 may be a Pt layer and the upper layer 4211 may be an Ag layer. The linear expansion coefficient of Ag is as large as 19 ppm/° C. Therefore, the tensile stress is increased and the entire connection electrode 421 can be easily peeled off.

The connection electrode 421 is not limited to the two-layer structure. The connection electrode 421 may have a multi-layer structure of three or more layers. For example, an intermediate layer (not shown) that functions as a barrier layer may be provided between the lower layer 4210 and the upper layer 4211. As the intermediate layer, for example, a Ti layer can be used.

The configuration of the present embodiment can be combined with the modification shown in the first embodiment and the configuration shown in the second embodiment.

Fourth Embodiment

The present embodiment is a modification of the preceding embodiments as a basic configuration and may incorporate the description of the preceding embodiments. In the preceding embodiment, the connection electrode 421 has only a layer(s) that is formed by removing (peeling off) the portion arranged on the silicon oxide film. Alternatively, the connection electrode 421 may have a plating layer disposed in the opening 46a after the protective film 46 is formed.

Figure 20:
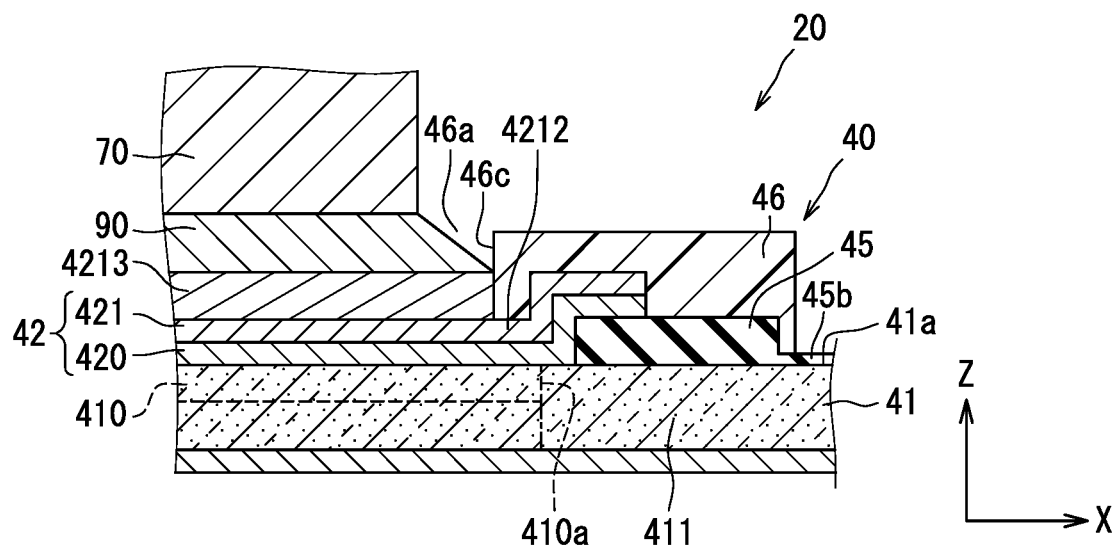
FIG. 20 is a diagram illustrating a cross-sectional view of a semiconductor device according to a fourth embodiment.

FIG. 20 is a cross-sectional view showing a semiconductor device 20 according to the present embodiment. FIG. 20 also shows a solder connection structure between the semiconductor element 40 and the terminal member 70, as in FIG. 16. Similarly to the third embodiment (see FIG. 19), the connection electrode 421 has a two-layer structure. The connection electrode 421 has a lower layer 4212 which is a layer in contact with the base electrode 420 and an upper layer 4213 which is a layer in contact with the solder 90.

The lower layer 4212 is formed on the base electrode 420 by the same method as the method for forming the connection electrode 421 described in the preceding embodiment. The upper layer 4213 is formed in the opening 46a by a plating technique. The upper layer 4213 is stacked on the base electrode 420 exposed from the opening 46a of the protective film 46. In the present embodiment, a Ni layer formed by a sputtering technique is used as the lower layer 4212, and a Ni layer formed by an electroless plating technique is used as the upper layer 4213. The upper layer 4213 is thicker than the lower layer 4212.

Summary of Fourth Embodiment

As described above, the connection electrode 421 of the present embodiment has the upper layer 4213 which is a plating layer. The boundary between the outer peripheral edge of the upper layer 4213 and the protective film 46 is located above the base electrode 420 and the active region 410 in a plan view. Even if the thermal stress is concentrated on the boundary between the outer peripheral edge of the upper layer 4213 and the protective film 46, the lower layer 4212 (Ni layer) located directly under the boundary is harder than the base electrode 420 (Al alloy). Further, since the boundary between the outer peripheral edge of the lower layer 4212 and the protective film 46 is located more to outside than the active region 410, the thermal stress is dispersed. Therefore, it is possible to suppress the occurrence of cracks in the base electrode 420 as well as damage to the active region 410.

When the plating layer is directly formed on the base electrode, an etching process for removing the oxide film on the surface of the base electrode is required. When the oxide film is removed, the surface of the base electrode becomes uneven due to the erosion of Al. The eroded part has a depressed shape, and thermal stress tends to concentrate thereon. On the other hand, in the present embodiment, the upper layer 4213, which is a plating layer, is formed above the base electrode 420 (Al alloy layer) via the lower layer 4212. Therefore, the step of removing the oxide film is unnecessary, and the unevenness of the surface of the base electrode 420 can be suppressed.

The configuration of the present embodiment can be combined with the modification shown in the first embodiment and the configuration shown in the second embodiment.

Fifth Embodiment

The present embodiment is a modification of the preceding embodiments as a basic configuration and may incorporate the description of the preceding embodiments. In the preceding embodiment, the part of the connection electrode 421 is covered with the protective film 46. Alternatively, a connection electrode arranged only in the opening 46a of the protective film 46 may be employed.

Figure 21:
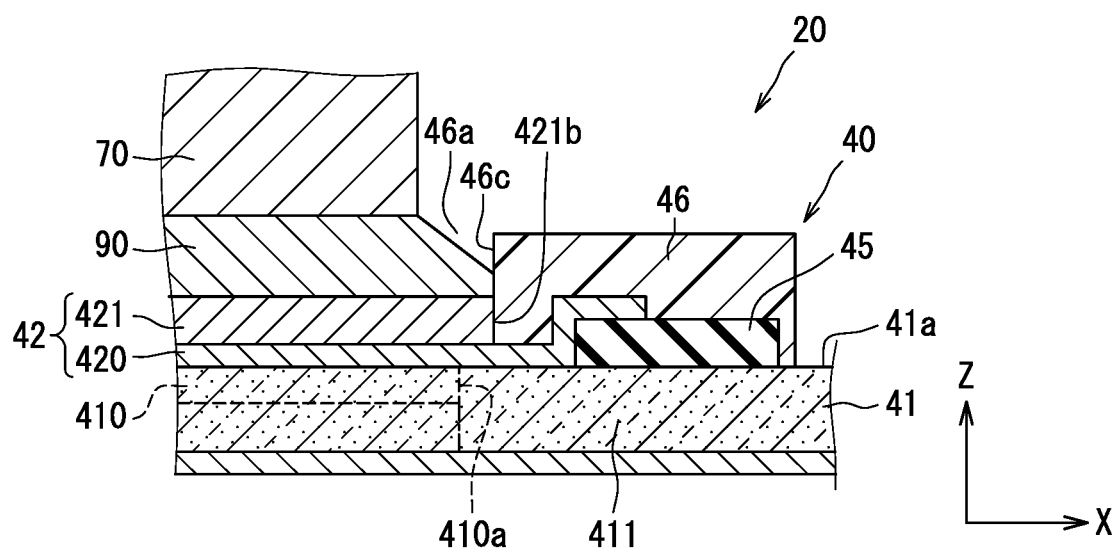
FIG. 21 is a diagram illustrating a cross-sectional view of a semiconductor device according to a fifth embodiment.

FIG. 21 is a cross-sectional view of a semiconductor device 20 according to the present embodiment. FIG. 21 also shows a solder connection structure between a semiconductor element 40 and a terminal member 70, as in FIG. 16. Differently from the preceding embodiment, the connection electrode 421 is arranged only in the opening 46a of the protective film 46. The connection electrode 421 is arranged on the base electrode 420 exposed from the opening 46a. The connection electrode 421 is, for example, a Ni layer formed by a plating technique.

The outer peripheral edge 421b of the connection electrode 421 is in contact with the opening end 46c of the protective film 46. The boundary (interface) between the connection electrode 421 and the protective film 46 is provided at a position overlapping the outer peripheral region 411 in a plan view.

Summary of Fifth Embodiment

In the present embodiment, the boundary between the connection electrode 421 and the protective film 46 is located more to outside than the outer peripheral edge 410a of the active region 410. Therefore, even if the thermal stress due to such as a power cycle and a cold cycle is concentrated in a portion directly under the boundary, it is less likely that a crack will develop into the active region 410. Accordingly, it is possible to suppress the active region 410 from being damaged by the thermal stress.

In the configuration of the present embodiment, the outer peripheral edge of the solder 90 substantially coincides with the opening end 46c of the protective film 46. Therefore, in a plan view, the outer peripheral edge 421b, the opening end 46c, and the outer peripheral edge of the solder 90 overlap each other. When the triple point is formed, the thermal stress is more likely to be concentrated in the portion directly below the triple point. However, in the present embodiment, since the boundary between the connection electrode 421 and the protective film 46 is located more to outside than the active region 410, it is possible to suppress the active region 410 from being damaged by the thermal stress.

OTHER EMBODIMENTS

The disclosure in this specification and drawings is not limited to the exemplified embodiments. The disclosure encompasses the above-described embodiments and modifications based on the embodiments by those skilled in the art. For example, the disclosure is not limited to the combinations of components and/or elements shown in the embodiments. The present disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, the drawings, and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

Descriptions of an element or a layer being "disposed on", "connects to", or "connected to" may mean the element or the layer is directly disposed on, directly connects to, or is directly connected to another element or another layer, or an intervening element or an intervening layer may be present therebetween. In contrast, when an element or a layer is described as "disposed directly on", "directly connects to" or "directly connected to" another element or layer, an intervening element or an intervening layer is not present therebetween. Other terms used to describe the relationships between elements (for example, "between" vs. "directly between", and "adjacent to" vs. "directly adjacent to") should be interpreted similarly. As used herein, the term "and/or" includes any combination and all combinations relating to one or more of the related listed items. For example, the term A and/or B includes only A, only B, or both A and B. Likewise, the term "at least one of A and B" includes only A, only B, or both A and B.

Spatial relative terms "inside", "outside", "back", "bottom", "low", "top", "high" and the like are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" or "directly above" the other element or feature. Therefore, the term "below" can include both above and below. The device may be oriented in the other direction (rotated 90 degrees or in any other direction) and the spatially relative terms used herein are interpreted accordingly.

The vehicle drive system 1 is not limited to the above configuration. For example, the vehicle drive system 1 having one motor generator 3 has been exemplified. However, the present disclosure is not limited to such an example. The vehicle drive system 1 to which the semiconductor device of the present disclosure is employed may have a plurality of motor generators. The power conversion device 4 including the inverter 6 as the power converter has been exemplified. However, the power conversion device 4 is not limited to this example. For example, the power conversion device 4 may include a plurality of inverters. The power conversion device 4 may include at least one inverter and at least one converter. The power conversion device 4 may include the converter only.

The configuration of the semiconductor device 20 is not limited to the above described example. The semiconductor device 20 may include at least the semiconductor element 40.

The semiconductor element 40 having, as the main electrodes, the emitter electrode 42 on the front surface 41a and the collector electrode 43 on the back surface 41b has been exemplified. However, the configuration of the semiconductor element 40 is not limited to the example described. The semiconductor element 40 may have the main electrodes only on the front surface 41a.

The opening 46a having the rectangular shape in the plan view has been exemplified. However, the shape of the opening 46a is not limited to the example described.

The semiconductor element 40 having the RC-IGBT as the element has been exemplified. However, the semiconductor element 40 is not limited to such an example. The switching element and the diode may be provided in separate chips. The IGBT has been exemplified as the switching element. However, the switching element is not limited to the IGBT. For example, the switching element may be MOSFET.

The configuration in which the back surfaces 50b and 60b of the heat sinks 50 and 60 are exposed from the sealing resin body 30 has been exemplified. However, the configuration of the semiconductor device 20 is not limited to such an example. At least one of the back surfaces 50b and 60b may be covered with the sealing resin body 30. At least one of the back surfaces 50b and 60b may be covered with an insulating member (not shown) different from the sealing resin body 30. The semiconductor device 20 including the sealing resin body 30 has been exemplified. However, the configuration of the semiconductor device 20 is not limited to such an example. The semiconductor device 20 may not have the sealing resin body 30.

The semiconductor device 20 including only one semiconductor element 40 constituting one arm has been exemplified. However, the configuration of the semiconductor device 20 is not limited to such an example. The semiconductor device 20 may include a plurality of semiconductor elements 40 constituting the upper and lower arm circuit 9 for one phase. The semiconductor device 20 may include a plurality of semiconductor elements 40 constituting the upper and lower arm circuits 9 for a plurality of phases.

The signal terminals 82 connected to the pads 44 via the bonding wires 91 have been exemplified. However, the connection of the signal terminals 82 may not be limited to such an example. For example, the signal terminals 82 may be connected to the pads 44 via solder.

What is claimed is:
1. A semiconductor device for a power conversion device, comprising:
   a semiconductor element including:
      a semiconductor substrate having an active region as an element formation region and an outer peripheral region, the active region being disposed adjacent to a front surface of the semiconductor substrate, the outer peripheral region surrounding the active region in a plan view projected in a substrate thickness direction orthogonal to the front surface of the semiconductor substrate;

a surface electrode including a base electrode disposed on the front surface of the semiconductor substrate and a connection electrode disposed on the base electrode; and a protective film covering a peripheral end portion of the base electrode and an outer peripheral edge of the connection electrode, the protective film defining an opening to expose the connection electrode so as to enable a solder connection to the connection electrode, wherein a boundary between the outer peripheral edge of the connection electrode and the protective film is located at a position corresponding to the outer peripheral region of the semiconductor substrate in the plan view in the substrate thickness direction.

2. The semiconductor device according to claim 1, wherein the semiconductor element includes a silicon oxide film disposed in an entire area of the front surface of the semiconductor substrate excluding a connection area where the front surface and the surface electrode are connected to each other, the peripheral end portion of the base electrode is a first peripheral end portion, the first peripheral end portion is stacked on a part of the silicon oxide film covered with the protective film, and the connection electrode has a second peripheral end portion that is stacked on the first peripheral end portion and covered with the protective film.

3. The semiconductor device according to claim 2, wherein the connection electrode is disposed to coincide with the base electrode in the plan view.

4. The semiconductor device according to claim 2, wherein the protective film has an opening end defining the opening, and the opening end is located at a position more to inside the outer peripheral edge of the connection electrode and corresponding to the active region in the plan view.

5. The semiconductor device according to claim 2, wherein the protective film has an opening end defining the opening, and the opening end is located at a position corresponding to the outer peripheral region in the plan view.

6. The semiconductor device according to claim 2, wherein the silicon oxide film has a compressive stress as an in-film residual stress, and the connection electrode has a tensile stress as an in-film residual stress.

7. The semiconductor device according to claim 2, wherein the connection electrode includes at least one metal layer that contains at least one from Ni, Pd, Au, Pt and Ag.

8. The semiconductor device according to claim 1, wherein the connection electrode is provided only within the opening and is stacked on a part of the base electrode exposing from the opening.

\* \* \* \* \*